United States Patent
Dagnachew

[11] Patent Number: 5,980,097
[45] Date of Patent: Nov. 9, 1999

[54] REDUCED COMPLEXITY SIGNAL CONVERTER

[75] Inventor: Birru M. Dagnachew, Eindhoven, Netherlands

[73] Assignee: U.S. Philips Corporation, New York, N.Y.

[21] Appl. No.: 08/795,823

[22] Filed: Feb. 6, 1997

[30] Foreign Application Priority Data

Feb. 23, 1996 [EP] European Pat. Off. ............. 96200467

[51] Int. Cl.$^6$ .................................................... G06F 17/10
[52] U.S. Cl. ................... 364/724.11; 364/133; 364/494; 364/602; 364/726.01; 365/45; 365/433
[58] Field of Search ............... 364/724.011, 133, 364/724.03, 726.01, 602, 494

[56] References Cited

U.S. PATENT DOCUMENTS 5,272,655  12/1993  Roza ........................................ 364/724
5,548,286   8/1996  Craven ..................................... 341/126
5,619,406   4/1997  Divan et al. .............................. 363/98

*Primary Examiner*—Reba I. Elmore
*Assistant Examiner*—McDieunel Marc
*Attorney, Agent, or Firm*—Jack D. Slobod

[57] ABSTRACT

In a signal converter which derives from an input signal having a sample rate R/q an output signal having a larger sample rate R, the input signal is combined with a feedback signal in a subtracter to form a single combined signal. Samples of the combined signal are mapped into a larger number of output samples by a mapper forming part of a mapping arrangement which also produces the feedback signal. The formation of a single combined signal makes the signal converter less complex in design than it would be if a number of combined signals were formed. In a further embodiment a noise shaping filter is interposed between the subtracter and the mapper.

7 Claims, 2 Drawing Sheets

REDUCED COMPLEXITY SIGNAL CONVERTER

BACKGROUND OF THE INVENTION

The invention is related to a signal converter for converting an input signal into an output signal, the signal converter including a combiner for deriving a combined signal from the input signal and a feedback signal and mapping arrangement configured for deriving from the combined signal both a plurality of samples of the output signal and the feedback signal.

Such a signal converter is known from U.S. Pat. No. 5,272,655.

Signal converters of this type are used, for example, in digital-to-analog converters operating according to the bit stream principle. In such converters, an input signal having a first sample frequency is transformed in an output signal having a second sample frequency. The input signal has a spectrum which is periodic with a period corresponding to the first sample frequency. Once the sample rate has been increased, the frequency spectrum of the output signal having the second sample rate continues to be periodic with a period corresponding to the first sample rate. However, a signal is desired which has a frequency spectrum that is only periodic with a period corresponding to the second (higher) sample rate. In order to realize this, a filter is required which eliminates the undesired frequency components. In a bit-stream type converter, this filtering is performed by a low pass filter present in the feed forward path of the bitstream type converter.

A problem with bit stream type converters, especially with high ratios of the second and first sample frequency is the high operating frequency of the sample rate converter. In the signal converter according to the above mentioned U.S. patent, the operating frequency is reduced with a factor p. This is obtained by using a mapping arrangement which generates in response to one sample of the output signal of the combining means p samples of the output signal. The output samples are downsampled using a plurality of feedback filters. The feedback signals are combined with filtered input signals to obtain a plurality of difference signals. Each of these difference signals are filtered using a separate filter and finally combined into the combined signal. The number of filters is equal to the order of the filtering required, which can result in an increased complexity. This increased complexity leads to a larger amount of silicon area if the signal converter is realized in hardware.

OBJECT AND SUMMARY OF THE INVENTION

The object of the present invention is to provide a signal converter according to the preamble of which the complexity has been reduced.

Therefore the signal converter according to the present invention is characterized in that the combiner is arranged for deriving one single combined signal, and in that the mapping arrangement is configured for deriving the feedback signal representing a decimated or downsampled and anti alias filtered output signal.

The invention is based on the recognition that it is possible to replace the plurality of filters by one single filter which performs downsampling and anti aliasing filtering of the output signal in order to obtain the feedback signal.

An embodiment of the invention is characterised in that the combiner comprises a noise shaping filter for obtaining the combined signal.

By introducing a noise shaping filter for filtering the combined signal, it becomes possible to optimize both the noise shaping characteristics of the signal converter and the anti-aliasing filtering performed in the feedback path.

A further embodiment of the invention is characterized in that the mapping arrangement is configured for providing a further signal representing the downsampled output signal, and in that the noise shaping filter also is arranged for deriving a filtered further signal for obtaining the combined signal.

The introduction of a further downsampled signal into the noise shaping filter, results in additional degrees of freedom, which can be exploited for optimizing the sample rate according to the present invention. In particular it allows a substantial independent optimization of the anti-aliasing filtering and the noise shaping characteristics.

A further embodiment of the invention is characterized in that the decimating and anti alias filtering has filtering has an impulse response corresponding at least partly to the impulse response of a comb filter.

It has turned out that a comb filter is very suitable to perform the filtering operation in the feedback path. Its complexity is very low, and it can attain good suppression of aliasing components. It also has a substantially constant transfer function in the pass band.

A further embodiment of the invention is characterized in that the mapping arrangement is configured for recursively determining the samples of the output signal from a filtered error signal, the error signal being representative of the difference between the input sample and a weighted sum of output samples already determined.

By recursively determining the samples of the output signal from the filtered difference between an input sample and a weighted sum of output samples already determined, it is possible to suppress undesired signals in the output signal by choosing a proper transfer function of the filter used for the filter operation.

A further embodiment of the present invention is characterized in that the mapping arrangement is configured for filtering the error signal according to a high-pass transfer function.

By using a high pass filtering function, it is possible to suppress undesired signals in the frequency band covering the input signal. Known signal converters often suffer from spurious signals in the frequency range of the input signal.

BRIEF DESCRIPTION OF THE DRAWINGS

The invention will now be explained with reference to the drawings, which shows in.

DETAILED DESCRIPTION OF THE PREFERRED EMBODIMENT

Figure 1:
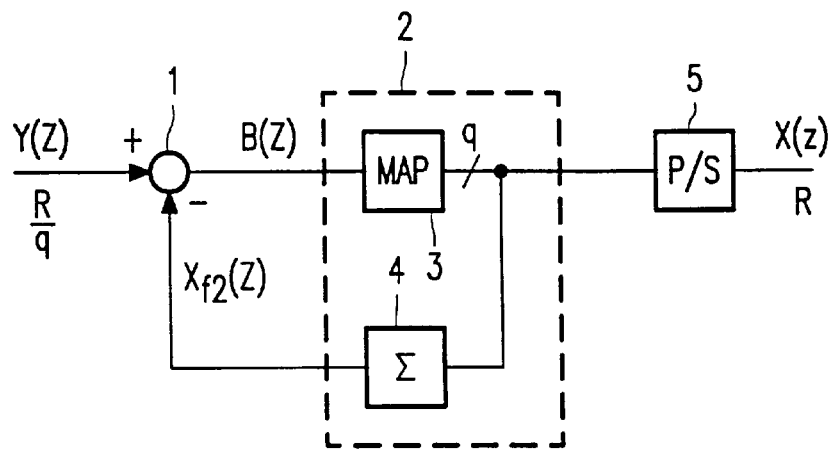
FIG. 1, a signal converter, being here a sample rate converter according to the present invention.

In the sample rate converter according to FIG. 1, an input signal Y(Z) having a sample rate R/q is applied to a first input of a combiner, being here a subtracter 1. The output signal of the subtracter 1 is connected to an input of mapping means 2. In the mapping arrangement 2, the output signal of the subtracter 1 is connected to a mapper 3. The output of the mapper 3 is connected to an input of weighted summing means 4 and to an input of a parallel to series converter 5. The output of the weighted summing means 4 with output signal $X_{f2}(Z)$ is connected to a second input of the subtracter 1. The output of the parallel to series converter 5, carrying output signal X(z) constitutes the output of the sample rate converter.

In the sample rate converter according to FIG. 1, the input signal Y(Z), the feedback signal $x_{f2}(Z)$ and the signal B(Z) have a sample rate R/q, in which R is the sample rate of the output signal X(z). The mapper 3 provides q output samples per input sample B(Z). It is observed that in the notation used for the signals X,Y, and b the value of Z is equal to $z^q$.

The operation of the sample rate converter according to the invention is based on the recognition that if the output signal $x_n$ is decimated after being filtered by a system filter $F_x(z)$ with impulse response $\{h_0, h_1, \ldots, h_{K-1}\}$ the resulting sequence $y_n$ can be described by:

$$y_n = \sum_{i=0}^{K-1} h_i \cdot x_{nq-i} \quad (1)$$

If the sequence $x_n$ is known, $y_n$ is a q-times decimated version of $F_x(z)$. X(z) where X(z) is the z-transform of the sequence $x_n$. In the sample rate converter according to the invention, the sequence $x_n$ has to be determined from $y_n$. In order to do so, (1) can be written as:

$$\sum_{i=0}^{q-1} h_i \cdot x_{nq-i} = y_n - \sum_{i=q}^{K-1} h_i \cdot x_{nq-i} \quad (2)$$

From (2) it can be seen that a weighted sum over the sequence $\{x_{nq-q+1}, x_{nq}\}$ can be recursively determined from $y_n$ and a weighted sum over the past sequence $\{x_{nq-K+1}, \ldots, x_{nq-q}\}$. In the sample rate converter according to FIG. 1, the weighted sum over the past sequence is determined by the weighting summer 4, and the subtraction of the weighted sum over the past sequence from the input sample $y_n$ is performed by the subtracter 1. The weighted sum over the sequence $\{x_{nq-q+1}, \ldots, x_{nq}\}$ is available as the signal $B_n$. The task of the mapper 3 is to provide the q samples of the sequence $\{x_{nq-q+1}, \ldots, x_{nq}\}$ in response to the signal $B_n$. This however cannot be done in a unique way, but there exist a large number of sequences $\{x_{nq-q+1}, \ldots, x_{nq}\}$ which have a weighted sum $B_n$. The values of x can be found with an exhaustive search minimizing the absolute value of the error between $B_n$ and the sum over the sequence $\{x_{nq-q+1}, \ldots, x_{nq}\}$. The weighted summer 3 derives a decimated feedback signal from the output signal. In order to reduce the amount of aliasing during decimation the filter $F_x(z)$ should have good suppression outside the frequency range of the input signal. In addition if spectrum correction is to be avoided, $F_x(z)$ should be substantially constant in the frequency range of the input signal. A suitable choice for the transfer function of the filter $F_x(z)$ is the transfer function of a comb filter or an approximation thereof. For the transfer function of the filter $F_x(z)$ can be written:

$$F_x(z) = c \frac{1}{q^m} \left( \frac{1-z^{-q}}{1-z^{-1}} \right)^m \quad (3)$$

In (3) c is the DC gain of the filter and m is the order of the filter $F_x(z)$. Inducing the property $(1-\alpha^n)=(1-\alpha)\cdot(1+\alpha+\alpha^2+\ldots\alpha^{n-1})$ into (3) results in:

$$F_x(z) = c \left( \frac{1}{q} \sum_{i=0}^{q-1} z^{-i} \right)^m \quad (4)$$

For m=2, (4) can be expanded into $$F_x(z) = \begin{cases} \frac{c}{q^2}(i+1)\cdot z^{-i}; & 0 \le i \le q-1 \\ \frac{c}{q^2}(2q-1-i)\cdot z^{-i}; & q \le i \le 2q-2 \end{cases} \quad (5)$$

If c is chosen such that $c/q^m$ is an integer power of 2, the filter according to (4) can be very easily be implemented. The weighted summer can be realized in the form of a look up table having stored the samples $h_q, h_{q+1}, \ldots, h_{K-1}$ of the impulse response of (4). In this case the value of K is $m\cdot(q-1)-1$. The inputs of the look up table are constituted by the sequence of output samples $\{x_{nq-K+1}, \ldots, X_{nq-q}\}$.

Figure 2:
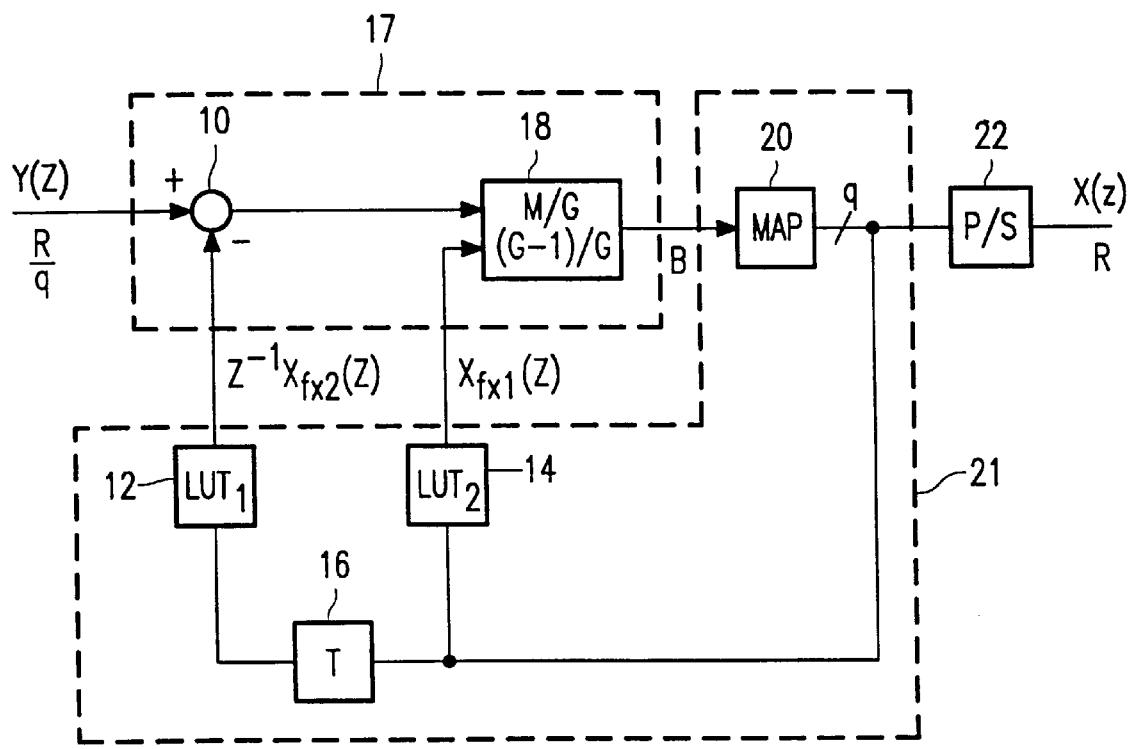
FIG. 2, a sample rate converter according to the invention in which a noise shaping filter is used.

In the sample rate converter according to FIG. 2, the input is connected to an input of combiner 17. In the combiner 17, the input signal is applied to a first input of a subtracter 10. The output of the subtracter 10 is connected to a first input of a noise shaping filter 18. The output of the filter 18, constituting the output of the combining 17 is connected to an input of the mapping arrangement 21. In the mapping arrangement 21 the input signal B is applied to an input of a mapper 20. The output of the mapper 20 is connected to an input of a parallel to serial converter 22, to an input of a look up table 14 and to the input of a delay element 16. The output of the look up table, carrying the further signal, is connected to a second input of the noise shaping filter 18. The output of the delay element 16 is connected to an input of a look up table 12. The output of the look up table 12, carrying the feedback signal is connected to a second input of the subtracter 10.

The embodiment according to FIG. 2 is based on the requirement to obtain noise shaping of the quantization error introduced in the mapping process. This quantization error can be modelled by an additive noise source whose output signal is added to the output signal of the mapper. Because the structure of the sample rate converter resembles that of a sigma-delta modulator, the noise shaping properties of a sigma-delta modulator are taken as starting point for the derivation of the required changes of the structure of the sample rate converter according to the invention to incorporate noise shaping.

For a sigma-delta modulator can be written:

$$U(z)=M(z)\cdot Y(z)+G(z)\cdot E(z) \quad (6)$$

In (6) U(z) is the z-transform of the output signal of the sigma-delta modulator, M(z) is the transfer function for the input signal of the sigma-delta modulator, Y(z) is the z-transform of the input signal, G(z) is the noise transfer function of the sigma-delta modulator, and E(z) is the z-transform of the quantization error. For the following analysis the filter function $F_x(z)$ is rewritten as:

$$F_x(z) = \sum_{i=0}^{q-1} h_i z^{-i} + \sum_{i=q}^{K-1} h_i z^{-i} = \quad (7)$$

-continued
$$\sum_{i=0}^{q-1} h_i z^{-1} + z^{-q} \sum_{i=0}^{q-1} h_i z^{-i} = F_{x1}(z) + z^{-q} F_{x2}(z)$$

If it is assumed that the error signal in the sample rate converter according to the invention has to be shaped with a noise transfer function G(Z) and that the expression for U(Z) of the sample rate converter according to the invention is similar to that of (6), with z being replaced by $Z=z^q$ due to the down sampling operation, (2) can be written as:

$$X_{fxi}(Z) = M(Z)\{Y(Z) + G(Z) \cdot E(Z)\} - Z^{-1}X_{fx2}(Z) \tag{8}$$

In (8) $X_{f_{x1}}(Z)$ is the q-times decimated version of $F_{x1}(z) X(z)$ and $X_{fx2}(Z)$ is the q-times decimated version of $F_{x2}(z) \cdot X(z)$. The signal B(Z) is equal to $X_{fx1}(Z)+E(Z)$. Substituting (8) in the above mentioned expression for B(Z) gives a value of B(Z) equal to:

$$B(Z) = \frac{M(Z)}{G(Z)}\{Y(Z) - Z^{-1}X_{fx2}(Z)\} + \frac{G(Z)-1}{G(Z)}X_{fx1}(Z) \tag{9}$$

The embodiment according to FIG. 2 is arranged for implementing (9). The combination of the delay element 16 and the look up table 12 is arranged for determining the signal $Z^{-1}X_{fx2}(Z)$ from the output signal of the mapper 20 and the look up table 14 is arranged for determining the signal $X_{fx1}(Z)$. The filter 18 is arranged for filtering the output signal of the subtracter 10 according to the transfer function M(Z)/G(Z), and for filtering the output signal of the look up table 14 by the transfer function {G(Z)–1}/G(Z). The transfer function G can be chosen according to similar stability criteria as used in the design of loop filters in sigma delta modulators.

Figure 3:
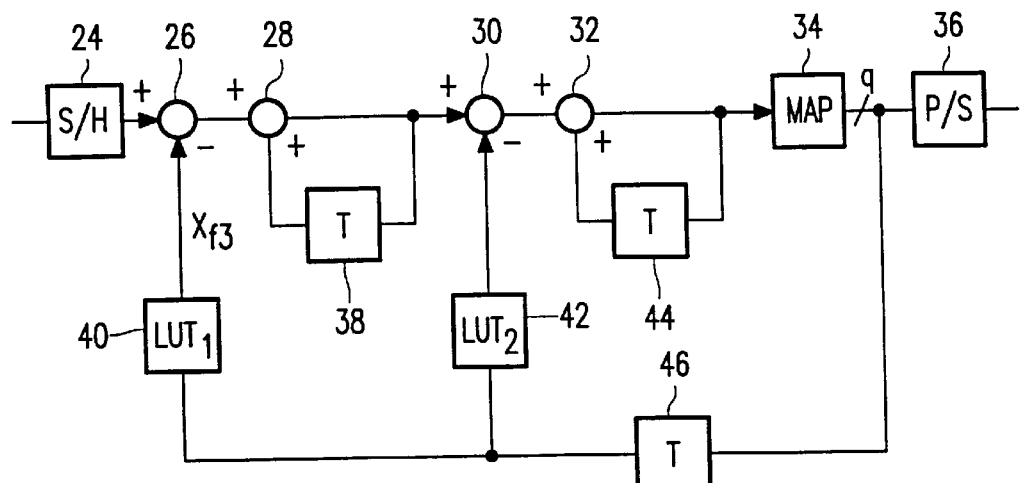
FIG. 3, a sample rate converter according to the invention using a second order noise shaping filter.

In the sample rate converter according to FIG. 3, an input signal is applied to an input of a sample and hold circuit 24. The output of the sample and hold circuit 34 is connected to a first input of a subtracter 26. The output of the adder 26 is connected to a first input of an adder 28. The output of the adder 28 is connected to an input of a subtracter 30 and to an input of a delay element 38. The output of the delay element 38 is connected to a second input of the adder 28.

The output of the subtracter 30 is connected to a first input of an adder 32. The output of the adder 32 is connected to an input of a mapper 34 and to an input of a delay element 44. The output of the delay element 44 is connected to a second input of the subtracter 32.

The output of the mapper 34 is connected to an input of a parallel to series converter 36 and to the input of a delay element 46. The output of the delay element 46 is connected to an input of a look up table 40 and to an input of a look up table 42. The output of the look up table 40, with output signal $X_{f3}$, is connected to a second input of the subtracter 26. The output of the look up table 42 is connected to a second input of the subtracter 30.

The sample rate converter according to FIG. 3 is obtained by choosing G(Z) to be equal to $(1-Z^{-1})^2$, and M(Z) being equal to 1. Substituting these value in (9) results in:

$$B(Z) = \frac{Y(Z) - Z^{-1}(X_{fx1}(Z) + X_{fx2}(Z))}{(1-Z^{-1})^2} - \frac{Z^{-1}X_{fx2}(Z)}{(1-Z^{-1})} \tag{10}$$

$X_{fx1}+X_{fx2}$ can be replaced by $X_{fx3}$, with $X_{fx3}$ being equal to:

$$x_{f3}(n) = \sum_{i=0}^{q-1} h_i \cdot x_{nq-i} + \sum_{i=0}^{K-q} h_{q+i} \cdot x_{nq-i} \tag{11}$$

In the block diagram according to FIG. 3, the signal $Z^{-1}X_{fx3}(Z)$ is generated by the combination of the delay unit 46 and the look up table 40. The signal $Z^{-1}X_{fx1}(Z)$ is generated by the combination of the delay unit 46 and the look up table 42. The transfer functions $1/(1-Z^{-1})$ and $1/(1-Z_{-1})^2$ are realized by a cascade connection of two integrators, the first integrator comprising the adder 28 and the delay element 38, and the second integrator comprising the adder 32 and the delay element 46.

If H(z) is chosen to be a second order comb filter having an impulse response defined by (5), $f_{x3}(k)$ can be written as:

$$F_{x3}(k) = \frac{c}{q^2}\left\{\sum_{i=0}^{q-1}(i+1) \cdot x_{nq-i} + \sum_{i=0}^{q-1}(q-1-i) \cdot x_{nq-i}\right\} = \frac{c}{q}\sum_{i=0}^{q-1} x_{nq-i} \tag{12}$$

Consequently, $X_{fx3}$ can be generated by using only a few exclusive OR gates for adding the samples $x_{nq-i}$.

Figure 4:
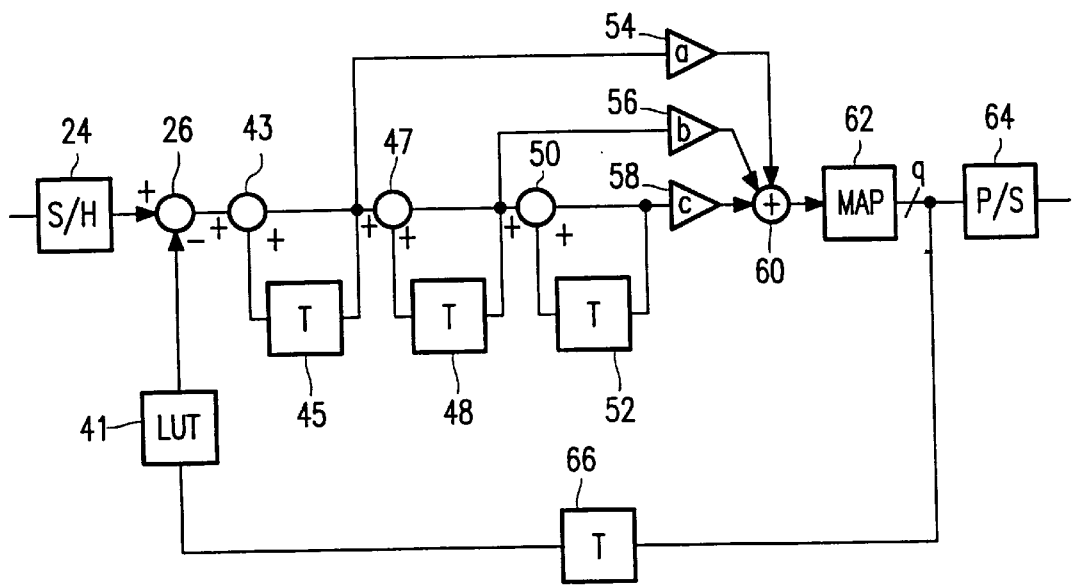
FIG. 4, a sample rate converter according to the present invention using a third order noise shaping filter.

In the sample rate converter according to FIG. 4, the input signal is applied to an input of a sample and hold circuit 24. The output of the sample and hold circuit 24 is connected to a first input of a subtracter 26. The output of the subtracter 26 is connected to a first input of an adder 43. The output of the adder 43 is connected to an input of a delay element 45, an input of an adder 47 and to the input of a multiplier 54. The output of the delay element 45 is connected to a second input of the adder 43.

The output of the adder 47 is connected to an input of a delay element 48, an input of an adder 50 and to the input of a multiplier 56. The output of the delay element 48 is connected to a second input of the adder 47.

The output of the adder 50 is connected to an input of a delay element 52, and to an input of a multiplier 58. The output of the delay element 52 is connected to a second input of the adder 50.

The output of the multiplier 54 is connected to a first input of an adder 60. The output of the multiplier 56 is connected to a second input of the adder 60. The output of the multiplier 58 is connected to a third input of the adder 60.

The output of the adder 60 is connected to an input of a mapper 62. The output of the mapper 62 is connected to an input of a parallel to series converter 64 and to an input of a delay element 66. The output of the delay element 66 is connected to an input of a look up table 41. The output of the look up table 41 is connected to a second input of the subtracter 26.

The sample rate converter according to FIG. 4 is obtained by choosing M(Z) to be equal to 1–G(Z). The function G(Z) is chosen to be equal to:

$$G(Z) = \frac{C(Z-1)^3}{(Z-p_1)(Z-p_2)(Z-p_3)} \tag{13}$$

C being a constant. Substituting these values in (9) results in:

$$B(Z) = \frac{1-G(Z)}{G(Z)}\{Y(Z) - X_{fx1}(Z) - Z^{-1}X_{fx2}(Z)\} \tag{14}$$

In which the term {1–G(Z)}/G(Z)} can be written as:

$$\frac{1-G(Z)}{G(Z)} = \frac{(Z-p_1)(Z-p_2)(Z-p_3) - C(Z-1)^3}{(Z-1)^3} = \frac{aZ}{(Z-1)} + \frac{bZ^2}{(Z-1)^2} + \frac{cZ^3}{(Z-1)^3} \tag{15}$$

The look up table 41 in the converter according to FIG. 4 is arranged for generating the signal $X_{fx2}(Z)+Z^{-1}X_{fx1}(Z)$.

The values chosen for a, b and c are 2.5, 1.5, and 0.75 respectively.

Figure 5:
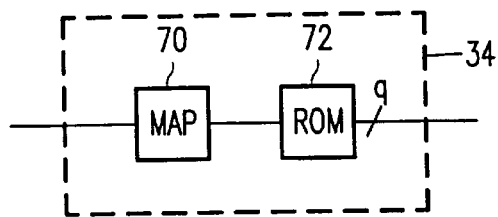
FIG. 5, a mapper to be used with the present invention.

The input of the mapper 34 according to FIG. 5 is connected to an input of a quantizer 70. The output of the quantiser, carrying an output signal representing the quantization level, is connected to an input of a ROM 72. At the output of the ROM 72 the output of the mapper is available. It is observed that the look up tables in the feed back path can be incorporated in the ROM 72. In that case the mapper 34 generates more than one output signal.

As was explained earlier, the task of the mapper 34 is to derive from an input signal $B_n$ a sequence of q samples $x_{nq-q+1} \ldots x_{nq}$ according to the equation $$B_n = \sum_{i=0}^{q-1} h_i \cdot x_{nq-i} \qquad (16)$$

If the number of possible values of x is limited to p, the number of values of $B_n$ which exactly are equal to (18) cannot exceed $q^P$. A way of implementing the mapper is to quantize the signal $B_n$ and use a ROM for generating the sequence $X_{nq-q+1} \ldots x_{nq}$ in response to the quantised version of $B_n$.

An improved mapping algorithm includes filtering of the quantization error in such a way that the error signal does not have descrete frequency components in the frequency band of the input signal. The filter $F_{x1}(z)$ is a filter with impulse response $h_0, h_1, \ldots, h_{q-2}, h_{q-1}$, with $h_0 \neq 0$. A vector x is defined as $\{x_0, x_1, \ldots, x_{q-1}\}$ and the vector Y is defined as $\{Y_0, Y_1, \ldots Y_{q-1}\}$ The impulse response of the $F_{x1}(z)$ can be cast in a q×q lower triangular Toeplitz matrix:

The relation between x and y can be described as $H \cdot x_T = Y^T$. It is observed that $B_n$ is equal to $H_q \cdot X^T + \epsilon_q$, in which $H_q$ is the last row of the matrix H, and $\epsilon_q$ is the quantization error involved with $B_n$. The vector Y can now be expressed as:

$$H = \begin{bmatrix} h_0 & 0 & \ldots & 0 & 0 \\ h_1 & h_0 & \ldots & 0 & 0 \\ \vdots & \vdots & \ddots & \vdots & \vdots \\ h_{q-2} & h_{q-3} & \ldots & h_0 & 0 \\ h_{q-1} & h_{q-2} & \ldots & h_1 & h_0 \end{bmatrix} \qquad (17)$$

$Y = \bar{Y} + \epsilon = \{y_0 + \epsilon_0, y_1 + \epsilon_1, \ldots, Y_{q-2} + \epsilon_{q-2}, B_n + \epsilon_{q-1}\}$, in which $y_0, y_1, \ldots, Y_{q-2}$ are still unknown, and $\epsilon_i$ is the quantization error in the samples $y_i$. By stating initially $h_{q-1} \cdot x_0 = B$, and $x_1 \ldots x_{q-1} = 0$, for the vector Y can now be found:

$$Y = \frac{B}{h_{q-1}} \{h_0, h_1, \ldots, h_{q-1}\} \qquad (18)$$

(20) is derived using $H \cdot x^T = Y^T$, with neglecting the errors $\epsilon$. When the errors $\epsilon^i$ are known, the value of x can be calculated according to:

$$x^T = H^{-1}(\bar{Y}^T + \epsilon^T) \qquad (19)$$

$$x^T = H^{-1}(\bar{Y}^T + \epsilon^T)$$

(22) has to be calculated recursively using starting values $x_0$ and $\epsilon_0$. Due to the fact that H is a lower triangular Toeplitz matrix, its inverse has a special structure where all its diagonal elements are equal to $1/h_0$, and all elements above the diagonal are zero. The elements $\hat{h}_{i,j}$ of $H^{-1}$ can generally be described as $\hat{h}_{q,q-i+j}$, where $\hat{h}_{q,k}$ is the $k^{th}$ element in the $q^{th}$ row of $H^{-1}$. These relations can be used in a recursive procedure to find the values of $x^i$ from the value of B as is given below.

$$\begin{aligned}
&\text{begin} \qquad (21)\\
&\xi = B \frac{h_0 \cdot \hat{h}_{1,1}}{h_{q-1}}\\
&\text{for } i = 0 \text{ to } q - 1 \text{ do}\\
&\quad \text{begin}\\
&\quad\quad x_i = Q[\xi]\\
&\quad\quad \epsilon_i = (\xi - x_i) h_0\\
&\quad\quad \xi = \sum_{j=1}^{i+2} \hat{h}_{i+2,j} \cdot h_{i+j} + \sum_{j=1}^{i+1} \hat{h}_{i+2,j} \cdot \epsilon_j\\
&\quad \text{end}\\
&\text{end}
\end{aligned}$$

In (23) Q[z] is a quantization operation which quantizes the value z to one of the allowed quantization values. (23) can be calculated by a mapper using a processor, or using a quantizer followed by a table. The quantizer levels of the quantizer can be determined beforehand by performing (23) for all possible values of B. The quantization levels for the quantizer are those values at which the sequence $X_{nq-q+1} \ldots x_{nq}$ changes.

I claim:

1. A signal converter for converting an input signal having a first sampling rate into an output signal having a second sampling rate larger than the first sampling rate, said signal converter comprising combining means for deriving a combined signal from the input signal and a feedback signal, and mapping means for deriving from a sample of the combined signal a sequence of samples of the output signal, the mapping means being further arranged for deriving the feedback signal from samples of the combined signal, wherein the combining means are arranged for deriving one single combined signal, and the mapping means are arranged such that the derived feedback signal represents a decimated and anti alias filtered version of the output signal.

2. The signal converter according to claim 1, wherein the mapping means comprise decimating means for deriving the feedback signal by decimating a signal representing the output signal.

3. The signal converter according to claim 1, wherein the combining means comprise a noise shaping filter for obtaining the combined signal.

4. The signal converter according to claim 3, wherein the mapping means are arranged for providing a further signal representing a downsampled version of the output signal, and the noise shaping filter also is arranged for deriving a filtered further signal for obtaining the combined signal.

5. The signal converter according to claim 1, wherein in deriving the feedback signal the mapping means have an impulse response corresponding at least partly to the impulse response of a comb filter.

6. The signal converter according to claim 5, wherein the mapping means are arranged for filtering the error signal according to a high-pass transfer function.

7. The signal converter according to claim 1, wherein the mapping means are arranged for recursively determining the samples of the output signal from a filtered error signal, the error signal being representative of the difference between the input sample and a weighted sum of output samples already determined.

* * * * *